United States Patent
Renmark et al.

(10) Patent No.: US 6,375,494 B2
(45) Date of Patent: Apr. 23, 2002

(54) METAL COMPONENT CARRIER

(75) Inventors: Ulrika Renmark, Flyinge; Christian Axelsson, Kristianstad, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/767,974

(22) Filed: Jan. 23, 2001

(30) Foreign Application Priority Data

Jan. 25, 2000 (EP) .............................................. 00610009

(51) Int. Cl.[7] ................................................. H01R 3/00
(52) U.S. Cl. .................... 439/500; 248/222.12; 206/701
(58) Field of Search ........................... 439/83, 500, 74, 439/92, 95, 828, 857; 248/222.12, 223.41, 312.1, 314; 220/402; 206/701, 703, 705, 719

(56) References Cited

U.S. PATENT DOCUMENTS

| 4,273,399 A | | 6/1981 | Myers et al. ................. 439/74 |
|---|---|---|---|
| 4,629,278 A | | 12/1986 | Norton et al. ................. 439/74 |
| 4,663,695 A | | 5/1987 | Ohkawara et al. ........... 361/773 |
| 5,272,597 A | | 12/1993 | Staples et al. ............... 361/816 |
| 5,749,740 A | * | 5/1998 | Swift et al. .................... 439/92 |
| 5,865,413 A | | 2/1999 | Niemann et al. ............ 248/314 |
| 5,928,035 A | * | 7/1999 | Jankowsky et al. .......... 439/607 |
| 5,984,697 A | * | 11/1999 | Moran et al. ................... 439/92 |
| 6,099,322 A | * | 8/2000 | Beloritsky et al. ............. 439/63 |
| 6,305,972 B1 | * | 10/2001 | Isbell et al. .................. 439/500 |

FOREIGN PATENT DOCUMENTS

| DE | 4332770 A1 | 3/1995 |
|---|---|---|
| EP | 0 739675 A2 | 10/1996 |
| JP | 07240654 | 9/1995 |
| JP | 11307997 | 11/1999 |

OTHER PUBLICATIONS

Annext to the European Search Report on European Patent Application No. EP 00 61 0009; Jun. 19, 2000, Page 1.

* cited by examiner

*Primary Examiner*—Tulsidad Patel
(74) *Attorney, Agent, or Firm*—Jenkens & Gilchrist, P.C.

(57) ABSTRACT

A component carrier for an electronic component, said component carrier being made in one piece of a metal sheet material and provided with means for surface mounting on a printed circuit board (PCB) and with holding flanges (2a, 2b) for holding an electronic component. The component carrier has a base (1) provided with a central soldering platform for surface mounting on the PCB. The holding flanges (2a, 2b) extend from the base (1) and are connected to the base (1) via tongues (4a–4d) of the metal sheet material, said tongues (4a–4d) extending in a plane parallel with the base (1).

5 Claims, 1 Drawing Sheet

METAL COMPONENT CARRIER

The invention relates to a component carrier for an electronic component, said component carrier being made in one piece of a metal sheet material and provided with means for surface mounting on a printed circuit board (PCB) and with holding flanges for holding an electronic component.

From DE-A1-43 32 770 a component carrier of this type is known, said component carrier being made in one piece of a highly thermally conductive material, such as metal, in order to obtain a good heat dissipation from the component, e.g. a power component, mounted in the component carrier. The component carrier is provided with a bottom plate from which holding flanges and an end stop extend. A component can be slid under the holding flanges until the end stop is reached. The component carrier may be surface mounted on the PCB.

U.S. Pat. No. 4,273,399 discloses another component carrier. This component carrier can be made from one piece of metal sheet material that is punched and formed. The component carrier is mountable on a PCB via solder tabs provided at the base of the component carrier. Holding notches are provided in the upper edges of sheet parts that extend perpendicular to the PCB. The component to be carried—a disc-like piezo-electric tone transducer—is to be snapped in between opposing holding notches. When mounting the component, the parts comprising the holding notches flex outwards exerting moments of force to the solder connections between the component carrier and the PCB.

U.S. Pat. No. 4,663,695 discloses yet another component carrier made in one piece of metal sheet material. This component carrier is U-shaped and provided with solder tabs at one end of the U for mounting on a PCB. A component, e.g. a crystal resonator, is mountable in the U-shaped component carrier that holds the component in place between the two legs of the U. Due to the design of the component carrier, the component has to be mounted in the component carrier before it is soldered to the PCB; hence this component carrier is not suitable for mounting and dismounting a component once it has been soldered to the PCB.

When mounting a component or a component carrier to a PCB by surface mounting, a small amount of soldering material is used, in contrast to mounting by solder tabs extending through holes in the PCB in which a relatively large amount of soldering material is used. Components or component carriers mounted by the surface mounting method are therefore more sensitive to loosening than components or component carriers mounted by way of solder tabs.

The surface mounted component carrier disclosed in DE-A1-43 32 770 is soldered to the PCB at its sides. However, when mounting the component the flanges at the sides are bent outwards, exerting stress on the solder joint. Over time the solder tin creeps and if the solder joint is exposed to a static load there is a risk that the component carrier drops off.

The risk of solder joint failure is even bigger when the component to be mounted is a dynamic component, such as a loud speaker, a microphone, a vibrator, a buzzer, etc.

The object of the present invention is to provide a component carrier that is surface mountable and in which the risk of dropping off due to solder joint failure is minimized.

This is achieved by providing the component carrier mentioned in the opening paragraph with a base provided with a central soldering platform for surface mounting on the PCB and with holding flanges extending from the base and connected to the base via tongues of the metal sheet material, said tongues extending in a plane parallel with the base.

Such a component carrier is soldable to the PCB at its central soldering platform, which is a part of the base. When the component carrier is soldered to the PCB, the holding flanges are allowed to flex out substantially without stressing the solder joint due to the flexible tongues connecting the holding flanges to the base. Therefore, a component can be mounted in the component carrier without detrimentally stressing the solder joint.

In a preferred embodiment the holding flanges extend substantially perpendicular to the base and each of at least two opposing holding flanges is provided with an inwardly extending collar for holding a part of the electronic component between said collar and said base. If the component has a shape that is engageable with the collars of the component carrier, this embodiment provides for a simple mounting and holding operation of a component, since no further mounting means is necessary.

The collar can be a rolled upper part of the respective flange giving the edge of the collar a rounded shape which allows an edge of the component to be snapped over the edge of the collar. This embodiment also allows for easy dismounting of a component due to the rounded edge of the collar.

Alternatively, the collar can be made as a simple angulation of the upper part of the respective, flange. This makes the manufacturing of the component carrier simple and the component can be mounted in the component carrier by sliding thereof under the collar.

In a preferred embodiment the component carrier has a generally rectangular shape and the tongues extend from the base to the corners of the component carrier. This configuration of the component carrier makes it suitable for a number of components and imparts high flexibility to the component carrier.

The invention will be described in detail in the following with reference to the drawings in which FIG. 1 shows a component carrier according to the invention in a first embodiment;

The component carrier is made in one piece that is punched out from a metal sheet and bent into the desired shape. Preferably, the material used is stainless steel but other types of metal could be used as well. The thickness of the metal sheet could be as small as 0.1 mm or even less.

Figure 1:
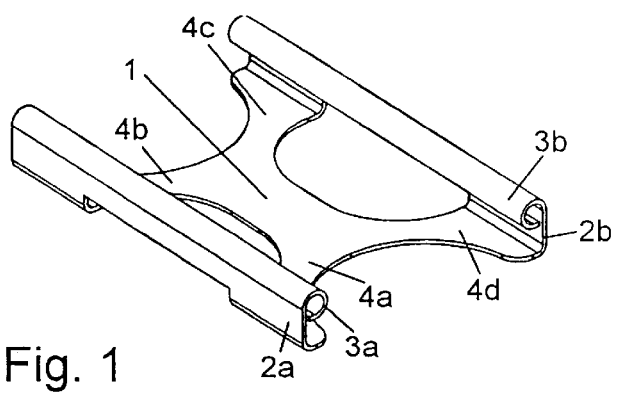

A preferred first embodiment of a component carrier according to the invention is shown in FIG. 1 that shows a component carrier having a base 1 and two holding flanges 2a, 2b extending upwards perpendicular to the base 1.

The upper ends of each flange 2a, 2b have been rolled to form an inwardly extending collar 3a, 3b that is engageable in a notch provided in the component to be mounted in the component carrier as it will be described below with reference to FIGS. 2 and 3.

Each of the upwardly extending flanges 2a, 2b is connected to the base 1 by means of two thin tongues 4a, 4b and 4c, 4d, respectively, said tongues 4a–4d extending in the plane of the base 1. The tongues 4a–4d have a relatively narrow width which makes them flexible in relation to the base 1, thereby allowing the upwardly extending flanges 2a, 2b to flex outwards when a component is mounted in the component carrier.

The component carrier is mounted on a PCB (not shown) by surface mounting. The solder joint is positioned centrally underneath the base 1, this area defining a central soldering platform. By having the solder joint positioned only at the centre of the component carrier, the flanges 2a, 2b are allowed to flex freely via the tongues 4a–4d substantially without stressing the solder joint.

Figure 2:
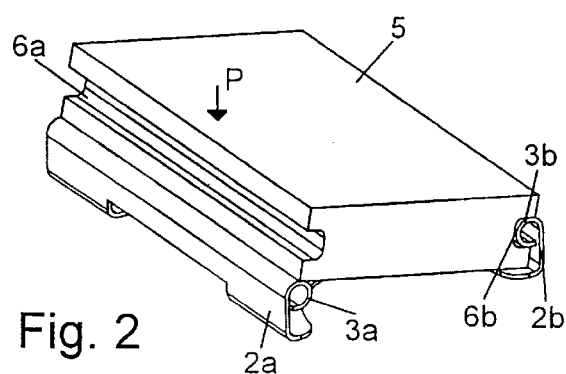
FIG. 2 shows the component carrier with a partly mounted component.
Figure 3:
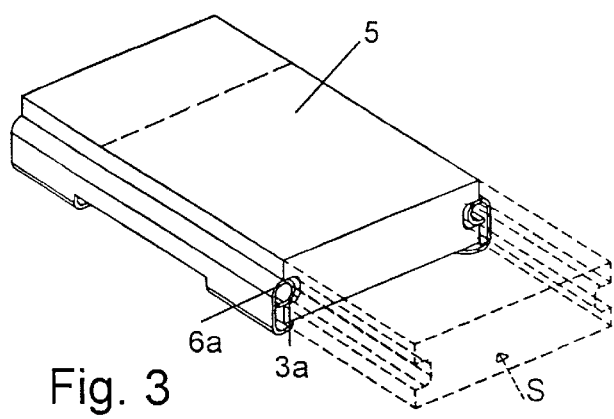
FIG. 3 shows the component carrier with a fully mounted component.

FIGS. 2 and 3 show how a component 5 is mounted in the component carrier. The component 5 may be any kind of electronic component, such as a loud speaker, a microphone, a vibrator, a buzzer or any other component that is not suitable for direct surface mounting on a PCB.

In the shown embodiment the component 5 is box-shaped but it could of course have any other shape fitting in the component carrier. Each side of the component is provided with a groove 6a, 6b that extends in the whole length of the component 5. The groove 6a, 6b is dimensioned so as to snap fit with the inwardly extending collar 3a, 3b of the component carrier.

When mounting the component 5 in the component carrier one groove 6b is positioned in engagement with the collar 3b of the flange 2b as shown. Pressing the other side of the component 5 downwards in the direction of the arrow P causes the flange 2a to flex outwards due to the rounded shape of the collar 3a. The component 5 is pressed further downwards until the collar 3a of the component carrier snaps into the groove 6a of the component 5 as shown with solid lines in FIG. 3.

FIG. 3 shows with dotted lines that the component 5 also could be slid in the direction of the arrow S into the component carrier if there is sufficient space to allow this type of mounting.

When the component 5 is mounted in the component carrier it is held between the collars 3a, 3b by friction forces. Preferably, the distance between the bottom of the grooves 6a and 6b slightly exceeds the distance between the innermost part of the collars 3a and 3b when the component 5 is not mounted in the component carrier. This means that when the component 5 is mounted in the component carrier, the flanges 2a, 2b are pressed slightly outwards, thereby exerting inwardly directed forces on the bottom of the grooves 6a, 6b.

The component 5 may be electrically connected to the PCB or to other components by any conventional means, such as wires, spring-biased terminals, etc. This, however, is not a part of the invention and is not shown.

Figure 4:
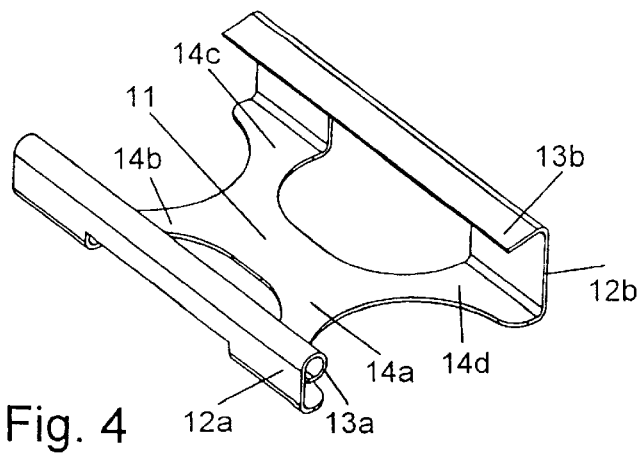
FIG. 4 shows a second embodiment of a component carrier according to the invention.

FIG. 4 shows a second embodiment of a component carrier according to the invention. This component carrier comprises a base 11 and upwardly extending flanges 12a, 12b provided with inwardly extending collars 13a, 13b. The flanges 12a, 12b are connected to the base 11 via thin tongues 14a, 14b, 14c and 14d.

In contrast to the embodiment shown in FIGS. 1-3, the collars 13a and 13b are not identical. The collar 13a is identical to each of the collars 3a and 3b of the first embodiment, whereas the collar 13b consists of a simple angulation of the upper part of the flange 12b. The collar 13b has a slightly downwards inclination from the upper end of the flange 12b that makes it possible for a component that is mounted in this component carrier to be wedged between the collar 13b and the base 11 or tongues 14c, 14d.

When a component is mounted in this component carrier, one edge of component is positioned underneath the collar 13b while the opposite edge rests upon the collar 13a in the same manner as was the case in the first embodiment shown in FIG. 2. The component is then pressed downwards until the collar 13a snaps into a groove provided in the component. Of course, the component may also be slid into position from the open end of the component carrier if there is sufficient space to allow this type of mounting.

Other modifications than the one shown in FIG. 4 are possible within the scope of the invention. For instance, a recess may be provided at the underside of the base, said recess defining the soldering platform.

It should be emphasized that the term "comprises/comprising" when used in this specification is taken to specify the presence of stated features, integers, steps or components, but does not preclude the presence or addition of one or more other features, integers, steps components or groups thereof.

What is claimed is:

1. A component carrier for an electronic component, said component carrier being made in one piece of a metal sheet material and comprising:
   means for surface mounting on a printed circuit board;
   a plurality of holding flanges for holding an electronic component; and
   a base provided with a central soldering platform for surface mounting on the printed circuit board, wherein the plurality of holding flanges extend from the base and are connected to the base via a plurality of tongues of the metal sheet material, said plurality of tongues extending in a plane parallel with the base.

2. A component carrier according to claim 1, wherein the plurality of holding flanges extend substantially perpendicular to the base and each of at least two opposing holding flanges of the plurality of holding flanges is provided with an inwardly extending collar for holding a part of the electronic component between said collar and said base.

3. A component carrier according to claim 2, wherein said collar is made as a rolled upper part of said each of at least two opposing holding flanges.

4. A component carrier according to claim 2, wherein said collar is made as an angulation of the upper part of said each of at least two opposing holding flanges.

5. A component carrier according to any one of claims 1–4, wherein the component carrier has a generally rectangular shape and the plurality of tongues extend from the base to corners of the component carrier.

* * * * *